United States Patent [19]
McHugh et al.

[11] Patent Number: 6,065,990
[45] Date of Patent: May 23, 2000

[54] ZIF PGA SOCKET

[75] Inventors: Robert G. McHugh, Evergreen, Colo.; Ming-Lun Seu, Taipei, Taiwan

[73] Assignee: Hon Hai Precision Ind. Co., Ltd., Taipei Hsein, Taiwan

[21] Appl. No.: 09/128,769

[22] Filed: Aug. 4, 1998

[51] Int. Cl.[7] ....................................... H01R 4/50
[52] U.S. Cl. ............................................. 439/342
[58] Field of Search ..................... 439/342, 343, 439/73, 259, 263, 264, 266, 269.1

[56] References Cited

U.S. PATENT DOCUMENTS 5,855,489  1/1999  Walker ..................................... 439/342

*Primary Examiner*—Steven L. Stephan
*Assistant Examiner*—Eugene G. Byrd

[57] ABSTRACT

A ZIF PGA socket includes a cover slidably engaged with a base to which a cam is pivotably connected. The cam is selectively rotated in clockwise or counterclockwise directions thereby driving the cover to move laterally in opposite directions with respect to the base. The rotation plane of the cam is substantially parallel to the movement plane of the cover.

15 Claims, 9 Drawing Sheets

6,065,990

ZIF PGA SOCKET

BACKGROUND OF THE INVENTION

1. Field of the Invention

The present invention relates to a socket for a CPU, especially a ZIF PGA socket including a new actuation structure by which the ZIF PGA socket is operative between a loosened status and a tightened status for receiving and securing pins of the CPU in position during insertion of the CPU into the socket.

2. The Prior Art

Conventional ZIF PGA connectors are usually installed with an actuation mechanism for controlling insertion/withdrawal of a CPU chip. Normally this actuation mechanism is controlled by a handle which normally operates in a vertical manner thus positioning the socket between a loosen status and a tightened status. In the loosen status the socket is ready to receive insertion of the CPU or withdrawal thereof with minimum friction. In the tightened status, the socket firmly secures pins of the CPU therein preventing the latter from withdrawal. The operation of the handle of the actuation mechanism due to its vertical manner usually causes an inconvenience due to blockage of other nearby components. To eliminate this problem, the handle portion of the actuation mechanism is replaced by an external handle tool such as a screw driver. FIGS. 10 and 11 illustrate a conventional ZIF PGA socket having a cover 100 defining a plurality of first passageways 146 therethrough and a first opening 110 in a first edge thereof. A base 300 is adapted to be slidably attached to the cover 110. The base 300 includes a plurality of second passageways 310 in alignment with the corresponding first passageways 146. Each second passageway 310 receives a contact for electrical and mechanical engagement with a pin of a corresponding component. The base also defines a second opening 340 at an edge thereof substantially communicating with the first opening 110 of the cover 100. The cover 100 comprises two side walls 130 extending downward from two sides thereof, each defining two recesses 135 in an interior surface thereof. The base 300 has two protrusions 320 formed on each of opposite side walls thereof for slidable reception in the corresponding recesses 135 of each side wall 130 of the cover 100. A first slot 120 is formed in an underface of the cover 100 communicating with the first opening 110. A second slot 330 is formed in the base 300 communicating with the second opening 340. An actuation device 200 is rotatably received between the first slot 120 of the cover 100 and the second slot 330 of the base 300 and includes a center rotation section 210. Two cam sections 220 are connected to opposite ends of the center rotation section 210, and an engagement slot 215 is defined on a circumferential periphery of the center rotation section 210 of the actuation device 200 for reception of an external tool (not shown) and actuation thereby within a ninety degree range so as to move the cover 100 via the two cam sections 230 in a horizontal direction with regard to the base 300. The actuation device 200 further comprises two end rotation sections 230 connected to the corresponding cam sections 220 for facilitating rotation of the actuation device upon operation of the external tool.

Although this conventional socket has solved the inconvenience mentioned above, the structure thereof is too complicated and the dimension especially the height thereof occupies too much space thus violating the trend of compactness in the computer field. Hence, it is requisite to provide a new structure for improving the above disadvantages.

SUMMARY OF THE INVENTION

The primary purpose of the present invention is to provide an improved ZIF PGA socket having a compact dimension especially regarding the height thereof.

The second purpose of the present invention is to provide an improved ZIF PGA socket having a simple structure.

The third purpose of the present invention is to provide an improved ZIF PGA socket which is easy to operate.

To fulfill the above purposes, a ZIF PGA socket in accordance with a first embodiment of the present invention comprises a longitudinal base, a cover slidably engaging with the base, and an actuation device pivotably fixed to the base for actuating the cover to move laterally with respect to the base. The base defines a first pivot member for pivotably engaging with the actuation device. The cover has a first stop and a second stop. The actuation device has a cam including a second pivot member for pivotably engaging with the first pivot member and a curved portion projecting therefrom for selectively contacting and driving either the first stop or second stop to force the cover to move laterally with respect to the base when the cam is operated to rotate with respect to the first pivot member of the base.

To fulfill the above purposes, a ZIF PGA socket in accordance with a second embodiment of the present invention comprises a longitudinal base, a cover slidably engaging with the base, and an actuation device comprising a cam pivotably fixed to the base for actuating the cover to move laterally with respect to the base. The cover has a first follower member and a second follower member. The cam has a driving member projecting therefrom for selectively contacting and driving the first follower member or the second follower member to force the cover to move laterally with respect to the base when the cam is operated to rotate with respect to the base. Whereby a rotation plane of the cam is substantially parallel to a movement plane of the cover.

To fulfill the above purposes, a ZIF PGA socket in accordance with a third embodiment of the present invention comprises a longitudinal base defining a recess, a cover slidably engaging with the base and comprising a first follower and a second follower, and a cam pivotably fixed in the recess of the base for actuating the cover to move laterally with respect to the base. The cam has a double-curved portion selectively contacting and driving either the first follower or the second follower to force the cover to move laterally in opposite directions upon reception of an external rotation force.

DETAILED DESCRIPTION OF THE PREFERRED EMBODIMENTS

Figure 1:
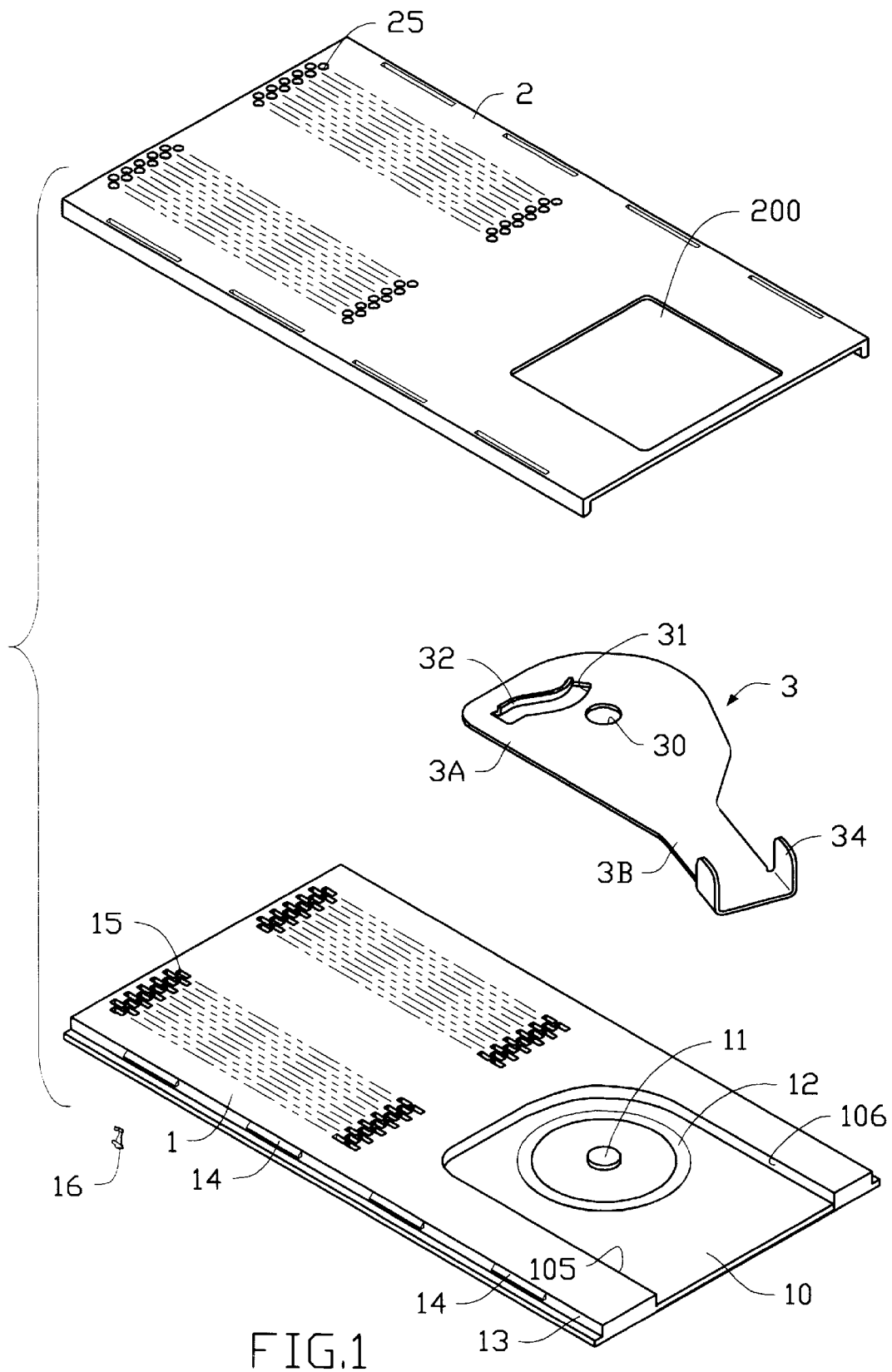
FIG. 1 is an exploded view of a ZIF PGA socket in accordance with the present invention.

Referring to FIG. 1, a ZIF PGA socket in accordance with the present invention comprises a longitudinal base 1, a cover 2 slidably engaging with the base 1, and an actuation device 3 pivotably fixed to the base 1. The base 1 defines a substantially U-shaped recess 10 bound by an inner wall 101, and upper and lower side walls 105, 106 and exposed to an edge of the base 1. A pivot 11 projects from a bottom surface of the recess 10 and a circular protrusion 12 is formed around the pivot 11, wherein the pivot 11 extends beyond the circular protrusion 12. A plurality of first passageways 15 are defined in the base 1 for receiving contacts 16 therein. The engagement between the first passageways 15 and the contacts 16 are well known thus the detailed description thereof is omitted herein. The base 1 has two longitudinal parallel side walls 13 on which a plurality of protrusions 14 are formed.

Figure 2:
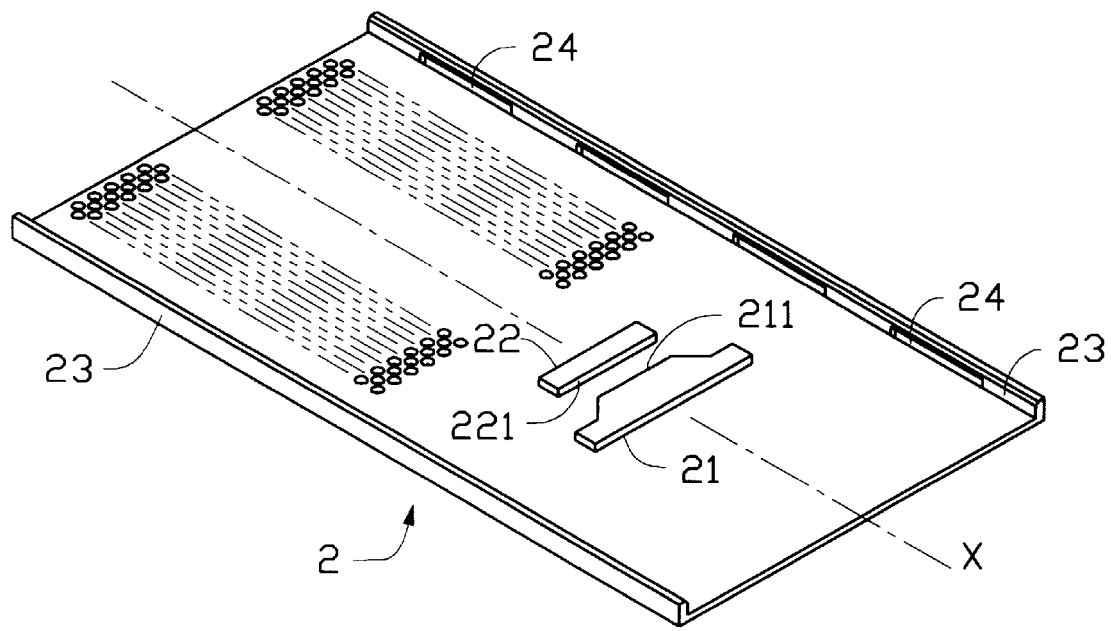
FIG. 2 is a bottom view of a cover of the ZIF PGA socket.

Referring to FIG. 2, the cover 2 has a first stop 21 and a second stop 22 each having one contacting side wall 211, 221 substantially parallel to and spaced from each other a predetermined distance. A normal line perpendicular to both parallel sides of the two stops 21, 22 is defined as an axis of movement X for the cover 2 with respect to the base 1. The axis for movement X is parallel to the longitudinal side walls 13 of the base 1. Two flanges 23 extend downward from longitudinal sides of the cover 2 for slidably engaging with the longitudinal side walls 13 of the base 1. A plurality of recesses 24 are defined in an inner wall of each flange 23 for loosely retaining the protrusions 14 of the base 1 therein. A plurality of second passageways 25 are defined in the cover 2 to be aligned with the first passageways 15 of the base 1 when the cover 2 is slidably engaged with the base 1. After the insertion of pins of a CPU chip (not shown) into the first and second passageways 15, 25, the pins will be driven by the second passageways 25 of the cover 2 to firmly engage with the contacts 16 of the base 1 when the cover 2 is driven by the actuation device 3 to have a relative displacement with respect to the base 1. The cover 2 also defines an upper recess 200 at the top surface thereof for accommodating a portion of the CPU such as Pentium II.

Figure 3:
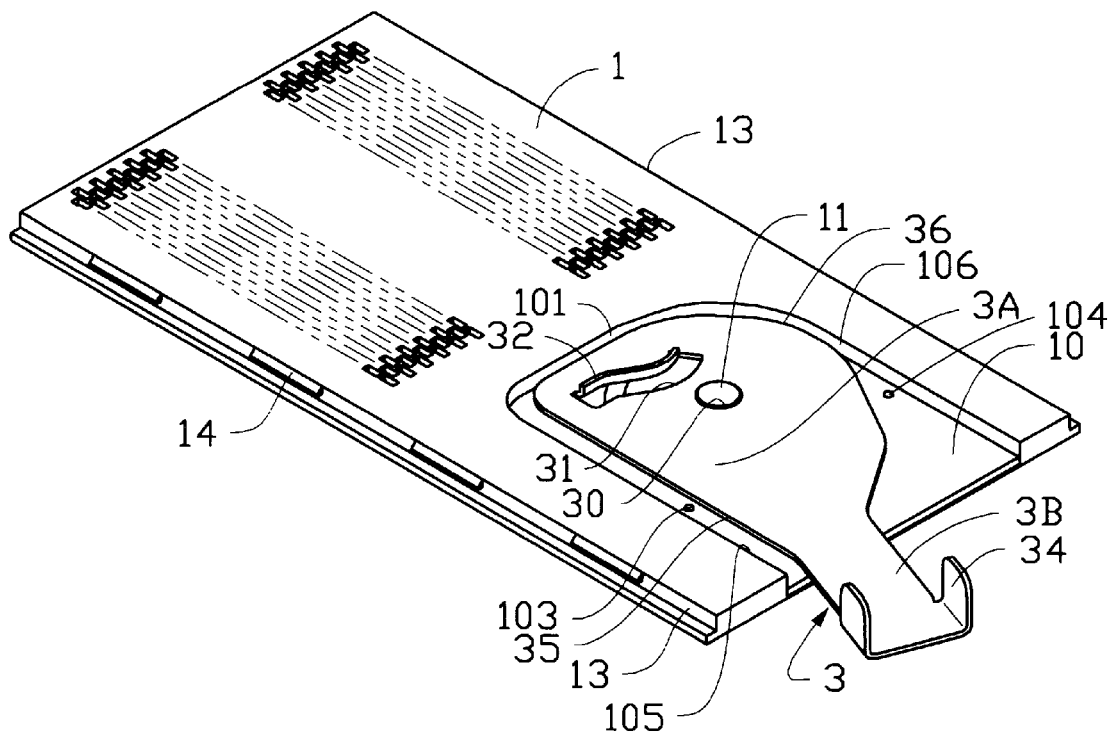
FIG. 3 is a perspective view of an actuation device fixed to a base of the ZIF PGA socket

Further referring to FIG. 1 together with FIG. 3, the actuation device 3 is a metal plate which has a cam portion 3A defining a hole 30 pivotal by engaging with the pivot 11 of the base 1 and a handle portion 3B extending from the cam portion 3A and comprising two ears 34 extending upward from two side end portions thereof for facilitating operation by a user. The cam 3A has upper and lower longitudinal sides 35, 36 which are bound by the side walls 105, 106 of the recess 10 when the actuation device 3 is fixed to the pivot 11. A substantially S-shaped slot 31 is defined in the cam portion 3A near the hole 30 and a substantially S-shaped tab 32 projects from an edge of the S-shaped slot 31. The S-shaped tab 32 may be formed by stamping.

Figure 4:
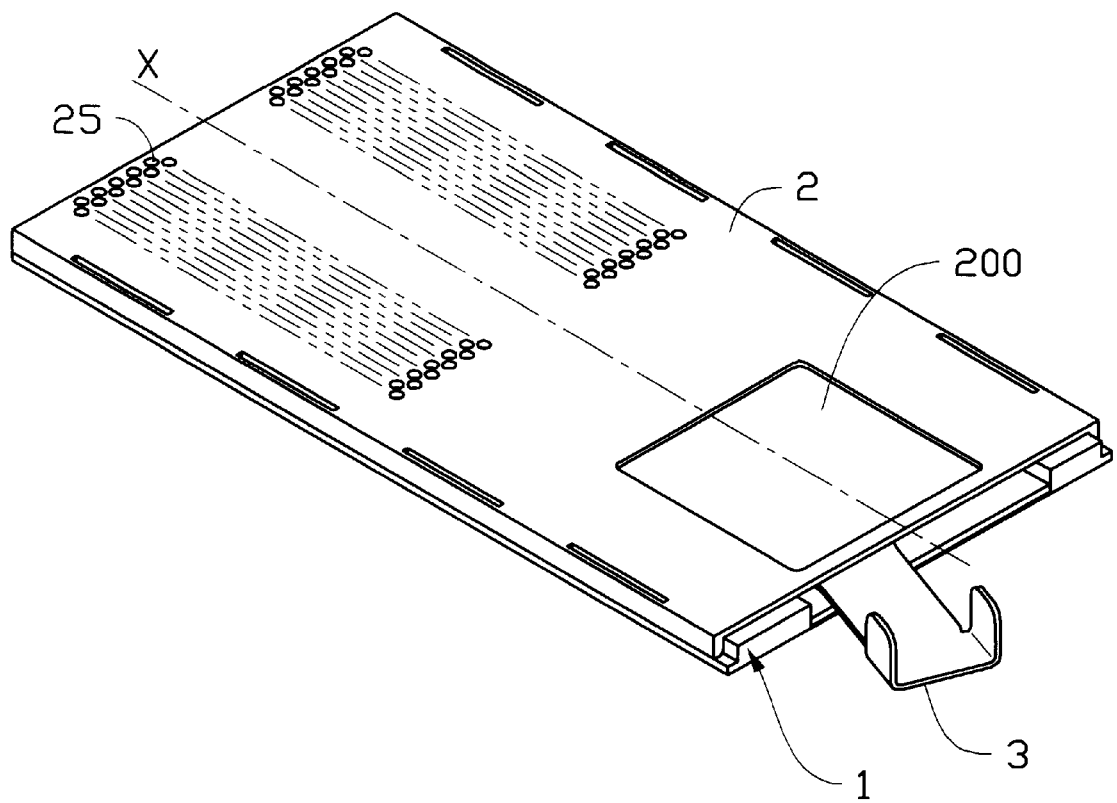
FIG. 4 is an assembled view of FIG. 1.

When assembled as shown in FIG. 4, the cover 2 is slidably engaged with the base 1, whereby the flanges 23 thereof loosely clip the two side walls 13 of the base 1, the recesses 24 of the flange 23 loosely retain the protrusions 14 of the side walls 13 of the base 1, the S-shaped tab 32 of the cam portion 3A is positioned between the first and second stops 21, 22 of the cover 2, and each first passageway of the base 1 communicates with the corresponding second passageway 25 of the cover 2.

Referring back to FIG. 3, when the handle portion 34 of the actuation device 3 is manually operated, the cam 3A will be pivotal by moved with respect to the pivot 11 of the base 1 within a predetermined angle range substantially equal to thirty degrees thereby causing the S-shaped tab 32 to drive either the first stop 21 or the second stop 22 in opposite directions along the axis of movement X.

The relative orientation between the S-shaped tab 32 and the two stops 21, 22 of the socket during operation may be separated into five different status's as explained hereinunder.

Figure 5:
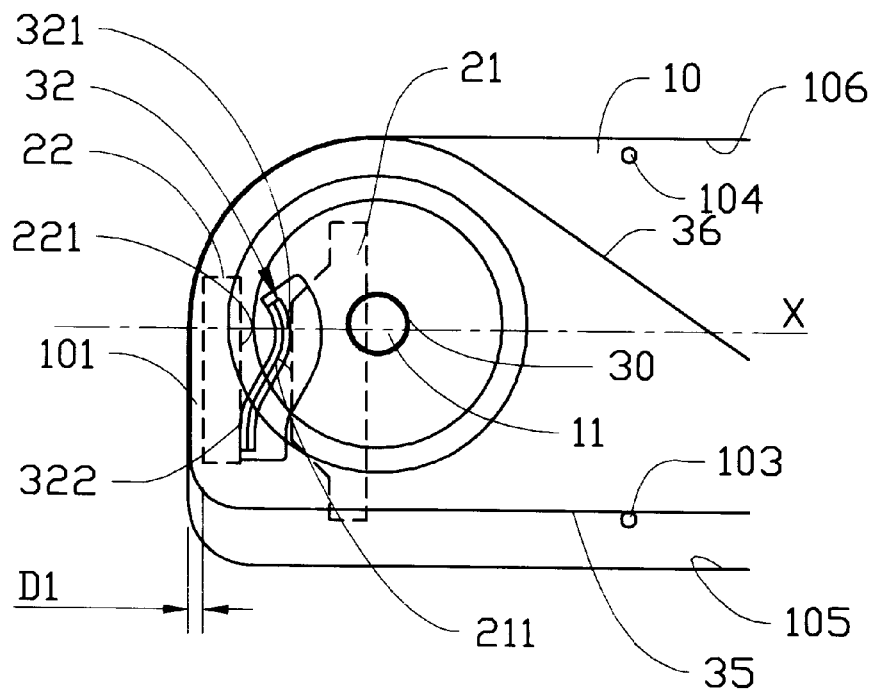
FIGS. 5 to 9 show different spatial relationships between an S-shaped tab of the actuation device and two stops when the cover is driven to move with respect to the base.

Referring to FIG. 5, the socket is in a first status (most-open status), wherein insertion/withdrawal of pins of the CPU is met with minimum resistance (zero insertion force). In this embodiment, variation of a lateral distance D1 between an inner wall 101 of the recess 10 and the second stop 22 can be interpreted as the movement distance of the cover 2 with respect to the base 1. A third stop 103 and a fourth stop 104 project from the bottom surface of the recess 10 for respectively stopping the longitudinal sides 35, 36 of the cam 3A when the latter rotates in the recess 10. At this position, the lower side 35 of the cam 3A is substantially parallel to the side wall 105 of the recess 10 (a 0-degree angle therebetween) and is also blocked by the third stop 103. The S-shaped tab 32 comprises an upper curved portion 321 and a lower curved portion 322 contacting the first and second stops 21, 22, respectively. Specifically, the upper curved portion 321 and the lower curved portion 322 each have C-shaped structures with the openings thereof being oriented in opposite directions.

Figure 6:
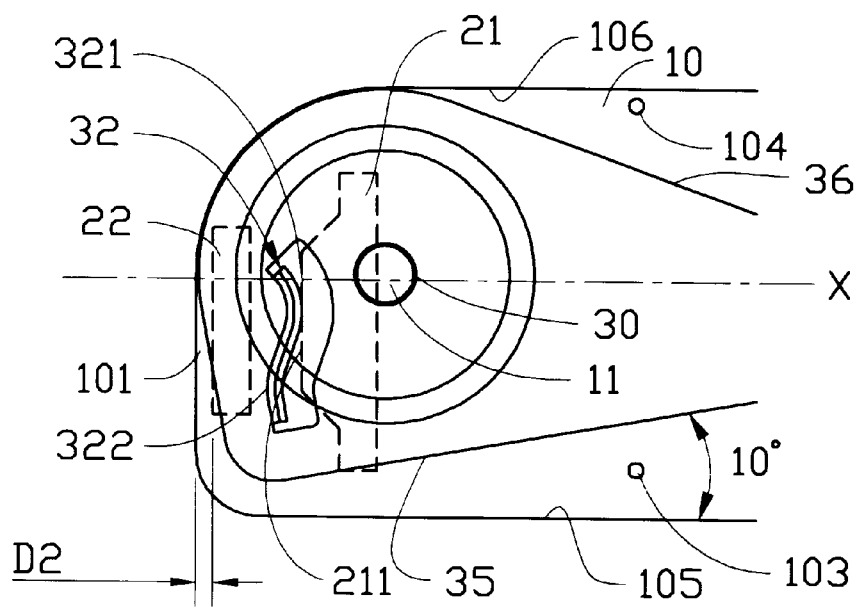

Referring to FIG. 6, the socket is in a second status, wherein the cam portion 3A is rotated counterclockwise with respect to the pivot 11 at a 10-degree angle, therefore the S-shaped tab 32 is moved counterclockwise with respect to the pivot 11. Meanwhile, the lower curved structure 322 separates from the second stop 22 while the upper curved structure 321 rolls along the contacting side wall 211 of the first stop 21 and forces the cover 2 to move laterally along a positive X direction with respect to the base 1. The distance between the second stop 22 and the inner wall 101 of the recess 10 is changed from D1 (FIG. 5) to D2, wherein D2 is greater than D1. The distance of movement of the cover 2 from the first status to the second status is (D2-D1). The upper curved portion 321 of the S-shaped tab 32 and the first stop 21 continue to change contacting points therebetween thereby preventing wear thereof.

Figure 7:
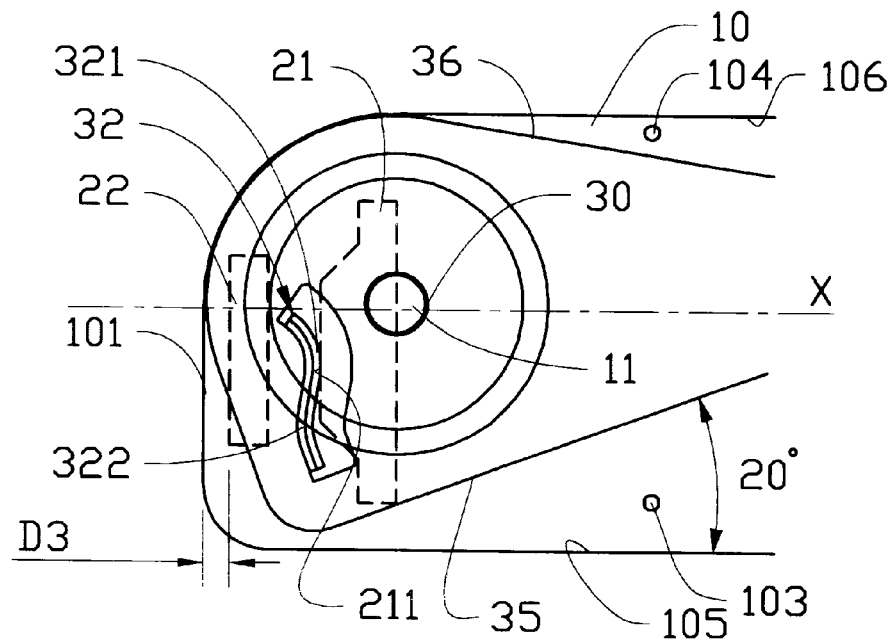

Referring to FIG. 7, the socket is in a third status, wherein the cam portion 3A is further rotated counterclockwise with respect to the pivot 11 an additional ten degrees, therefore the S-shaped tab 32 is moved counterclockwise with respect to the pivot 11. Meanwhile, the upper curved structure 321 continues to roll along the contacting surface of the first stop 21 and forces the cover 2 to move laterally along the positive X direction with respect to the base 1. The distance between the second stop 22 and the inner wall 101 of the groove 10 is changed from D2 (FIG. 6) to D3, wherein D3 is greater than D2. The moving distance of the cover 2 from the previous status to the third status is (D3-D2). The upper curved portion 321 of the S-shaped tab 32 and the first stop 21 continue changing contacting points therebetween thereby preventing wear thereof.

Figure 8:
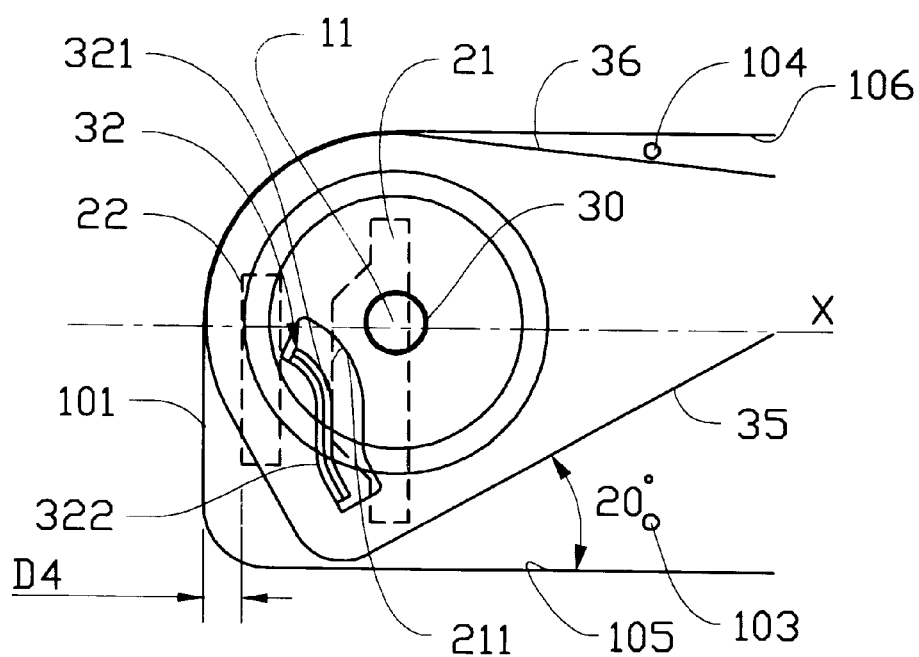

Referring to FIG. 8, the socket is in a fourth status, wherein the cam portion 3A is further rotated counterclockwise with respect to the pivot 11 an additional ten degrees until the upper side 36 of the cam 3A is stopped by the fourth stop 104. The socket is at a minimum open status, whereby pins of the CPU are firmly retained in the passageways 15, 25 of the socket. The S-shaped tab 32 is moved counterclockwise with respect to the pivot 11, meanwhile the upper curved structure 321 continues to roll along the contacting surface of the first stop 21 and forces the cover 2 to move laterally in the positive X direction with respect to the base 1. The distance between the second stop 22 and the inner wall 101 of the recess 10 changes from D3 (FIG. 7) to D4, wherein D4 is greater than D3. The moving distance of the cover 2 from the previous status to the fourth status is (D4-D3).

Figure 9:
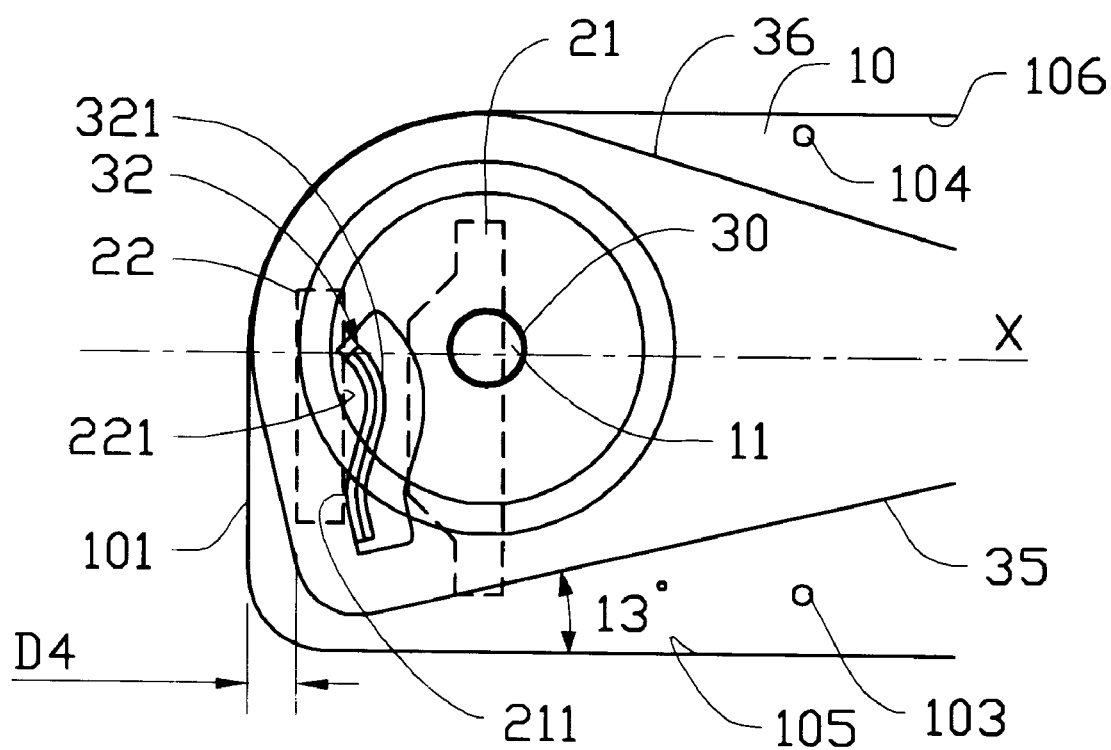
Figure 10:
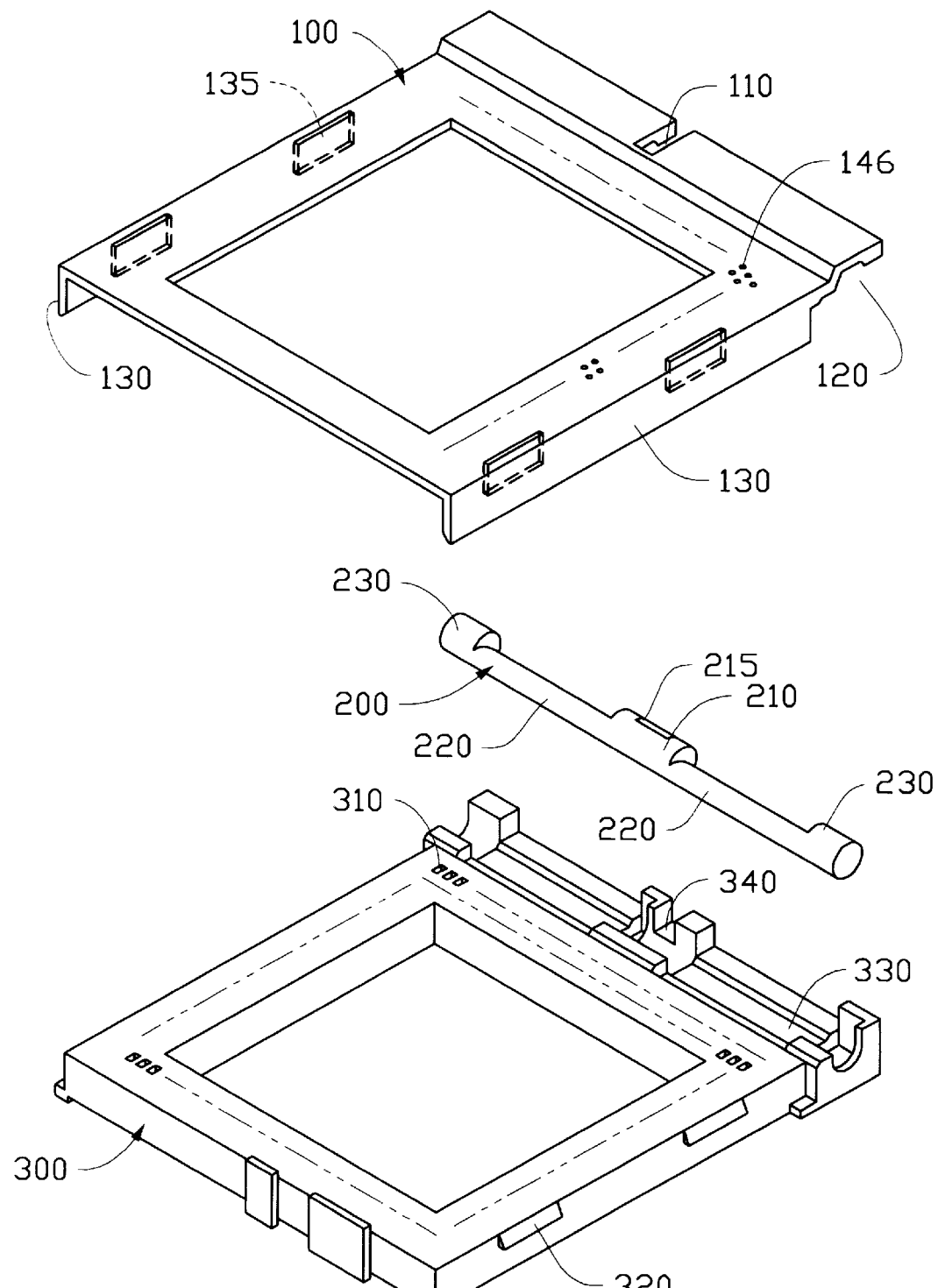
FIG. 10 is an exploded view of a conventional ZIF PGA socket.
Figure 11:
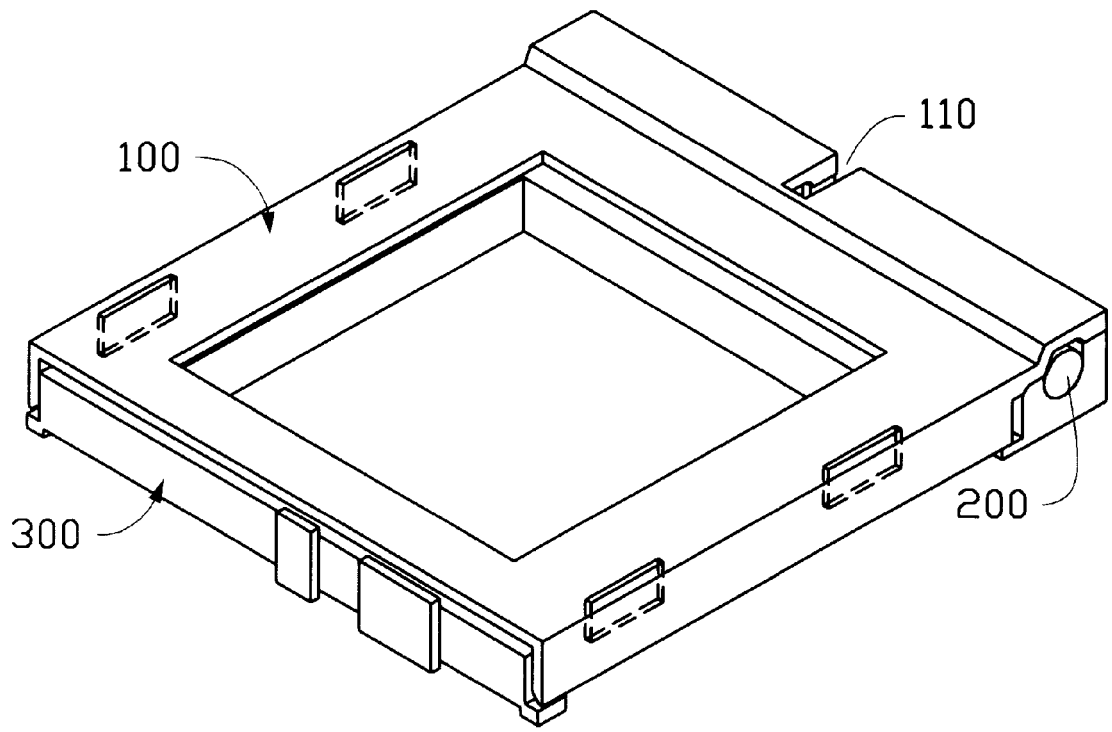
FIG. 11 is an assembled view of FIG. 10.

Referring to FIG. 9, the socket is in a fifth status. From the fourth status to the fifth status, the cam portion 3A is rotated clockwise with respect to the pivot 11, the side 36 of the cam 3A separates from the fourth stop 104, and the upper curved structure 321 separates from the first stop 21 until the lower curved structure 322 contacts the second stop 22 with the angle between the lower side 35 of the cam 3A and the lower side wall 105 of the groove 10 equaling a specific angle, such as thirteen degrees. The distance between the second stop 22 and the inner wall 101 of the recess 10 is the same as that of the fourth status (FIG. 8).

The cam portion 3A is continuously driven to rotate clockwise until the socket recovers to the first status. Specifically, the lower curved structure 322 of the S-shaped tab 32 drives the second stop 22 to move in an opposite direction, i.e., negative X direction, to that moved from the first status to the fourth status until the distance between the second stop 22 and the inner wall 101 of the recess 10 changes from D4 to D1, the upper curved portion 321 of the S-shaped tab 32 contacts with the first stop 21, and the lower side 35 of the cam 3A is stopped by the third stop 103. More specifically, the lower curved structure 322 rolls along the contacting side wall 221 of the second stop 22 and forces the cover 2 to move laterally along the negative X direction with respect to the base 1 until the lower side 35 of the cam 3A is blocked by the third stop 103. Therefore, the cover 2 moves in the negative X direction a distance equaling (D4-D1) from the fifth status to the first status.

From the above description, it can be concluded that the socket experiences five status's in a cycle for moving the cover 2 from a left most position (FIG. 5) to a right most position (FIG. 8) and then back to the left most position (FIG. 5).

It can be noted that the invention provides mechanism for transforming a horizontal rotation movement to a horizontal linear movement. The actuation device 3 is horizontally pivotable around the pivot 11 wherein a driving tab 32 with a shorter force arm spaced from the pivot 11 and a handle ears 34 with a longer force arm spaced from the pivot 11 are respectively positioned on an inner side and an outer side of the socket. Under this situation, the operator may easily rotatably operate the actuation device 3 to slide the cover 2 horizontally with regard to the base 1 in a force-saving manner without using the additional tool. The horizontal rotation arrangement of the actuation device 3 with the handle ears 34 exposed in an exterior and cooperating with the longer force arm from the pivot 11, also results in less operation space in comparison with most traditional socket having a vertically rotatable actuation lever.

While the present invention has been described with reference to a specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A ZIF PGA socket comprising a longitudinal base, a cover slidably engaging with the base, and an actuation device pivotably fixed to the base for actuating the cover to move laterally with respect to the base;
   the base defining a first pivot member for pivotably engaging with the actuation device;
   the cover having a first stop and a second stop spaced apart from each other a predetermined distance;
   the actuation device having a cam including a second pivot member for pivotably engaging with the first pivot member and a curved portion projecting from the cam for selectively contacting and driving either the first stop or second stop to force the cover to move laterally with respect to the base when the cam is operated to rotate with respect to the first pivot member of the base.

2. The ZIF PGA socket as claimed in claim 1, wherein the actuation device is made from a metal plate.

3. The ZIF PGA socket as claimed in claim 2, wherein the curved portion of the actuation device is substantially an S-shaped structure.

4. The ZIF PGA socket as claimed in claim 3, wherein the S-shaped structure is divided into a first C-shaped structure and a second C-shaped structure each respectively and selectively contacting and driving the corresponding one of the first stop and the second stop.

5. The ZIF PGA socket as claimed in claim 4, wherein the curved portion of the actuation device rolls along a contacting surface of the first stop to force the cover to move laterally with respect to the base when the cam is manually driven to rotate in a first orientation.

6. The ZIF PGA socket as claimed in claim 5, wherein the curved portion of the actuation device rolls along a contacting surface of the second stop to force the cover to move laterally with respect to the base when the cam is manually driven to rotate in a second orientation.

7. The ZIF PGA socket as claimed in claim 4 further comprising a third stop formed on the base for limiting the cam to rotate clockwise beyond a predetermined angle.

8. The ZIF PGA socket as claimed in claim 4 further comprising a fourth stop formed on the base for limiting the cam to rotate counterclockwise below a predetermined angle.

9. The ZIF PGA socket as claimed in claim 2, wherein the first pivot member is a protrusion projecting from the base and the second pivot member is a hole defined in the cam for pivotably engaging with the protrusion of the base.

10. The ZIF PGA socket as claimed in claim 9 further comprising a closure protrusion projecting from the base and surrounding the pivot so that the actuation device can be positioned thereon for facilitating the rotation of the cam.

11. The ZIF PGA socket as claimed in claim 1 further comprising a handle extending from the cam of the actuation device.

12. A ZIF PGA socket comprising a longitudinal base, a cover slidably engaging with the base, and an actuation device comprising a cam pivotably fixed to the base for actuating the cover to move laterally with respect to the base;
   the cover having a first follower member and a second follower member spaced apart from each other a predetermined distance; and
   the cam having a driving member projecting therefrom for selectively contacting and driving the first follower member or the second follower member to force the cover to move laterally with respect to the base when the cam is operated to rotate with respect to the base;
   whereby a rotation plane of the cam is substantially parallel to a movement plane of the cover.

13. The ZIF PGA socket as claimed in claim 12, wherein the driving member is a double-curved structure projecting from the cam which has a first curved portion contacting with and driving the first follower member to move in a first direction after the cam is selectively rotated clockwise and a second curved portion contacting and driving the second follower member to move in a second direction opposite the first direction after the cam is selectively rotated counter-clockwise.

14. The ZIF PGA socket as claimed in claim 13, wherein the first follower member has a first contacting wall portion for contacting with the first curved portion of the driving member and the second follower member has a second contacting wall portion for contacting with the second curved portion of the driving member when the cam is rotated with respect to the base.

15. The ZIF PGA socket as claimed in claim 14, wherein the first contacting wall portion is parallel to the second contacting wall portion and perpendicular to an axis of movement of the cover.

* * * * *